(12) United States Patent
Suzuki

(10) Patent No.: US 6,995,349 B2
(45) Date of Patent: Feb. 7, 2006

(54) SOLID-STATE IMAGE PICKUP DEVICE AND METHOD FOR MANUFACTURING THE SAME

(75) Inventor: Hironobu Suzuki, Miyagi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 59 days.

(21) Appl. No.: 10/733,384

(22) Filed: Dec. 12, 2003

(65) Prior Publication Data

US 2004/0118993 A1    Jun. 24, 2004

(30) Foreign Application Priority Data

Dec. 17, 2002   (JP) .............................. 2002-365737

(51) Int. Cl.
*H01L 31/0232*   (2006.01)

(52) U.S. Cl. .................................................. 250/214.1

(58) Field of Classification Search ............. 250/208.1, 250/214.1; 257/435, 384
See application file for complete search history.

(56) References Cited

U.S. PATENT DOCUMENTS

| 5,202,282 A | 4/1993 | Son |
| 6,188,119 B1 * | 2/2001 | Ogawa ........................ 257/435 |

FOREIGN PATENT DOCUMENTS

| JP | 63-46763 A | 2/1988 |
| JP | 2001-223352 A | 8/2001 |

* cited by examiner

*Primary Examiner*—David Porta
*Assistant Examiner*—Tony Ko
(74) *Attorney, Agent, or Firm*—Birch, Stewart, Kolasch & Birch, LLP

(57) ABSTRACT

In a solid-state image pickup device having a charge transfer electrode of multilayer electrode structure, a plurality of polycrystalline silicon electrode layers are formed; a sidewall dielectric film is interposed between sidewalls of the electrodes; and a silicide film is formed on the surface of a polycrystalline silicon film exposed from the sidewall dielectric film in a self-aligned manner.

7 Claims, 6 Drawing Sheets

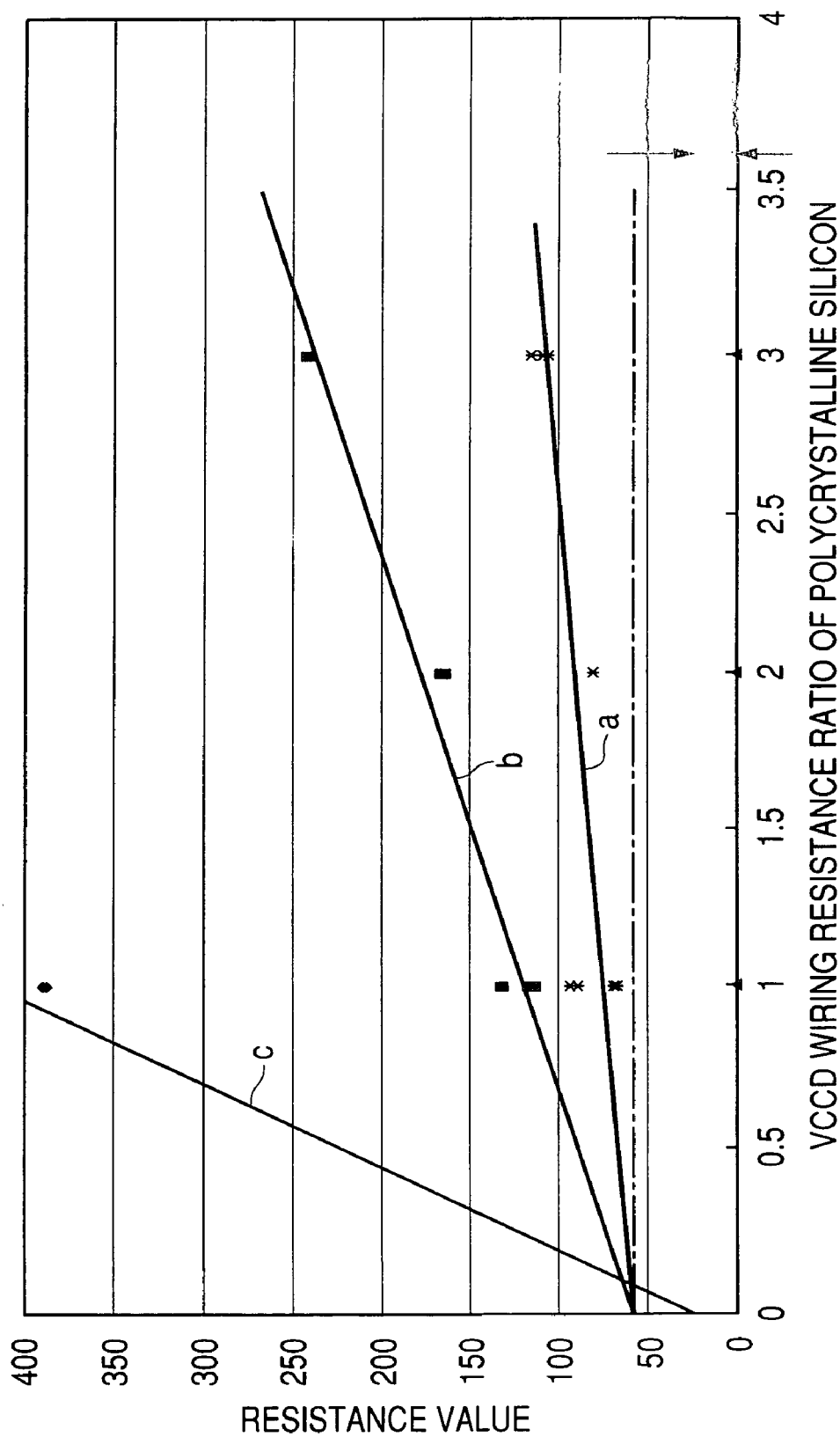

SOLID-STATE IMAGE PICKUP DEVICE AND METHOD FOR MANUFACTURING THE SAME

This Nonprovisional application claims priority under 35 U.S.C. § 119(a) on Patent Application No(s). 2002-365737 filed in JAPAN on Dec. 17, 2002, the entire contents of which are hereby incorporated by reference.

BACKGROUND OF THE INVENTION

1. Field of the Invention

The invention relates to a solid-state image pickup device and a method for manufacturing the solid-state image pickup device, and more particularly, to silicidation of a charge transfer electrode of a multilayer electrode structure.

2. Description of the Related Art

A CCD solid-state image pickup device used in an area sensor or the like has a photoelectric conversion section, such as a photodiode, and a charge transfer section equipped with a charge transfer electrode to be used for transferring a signal charge from the photoelectric conversion section. A plurality of charge transfer electrode are formed adjacent to a charge transfer path formed on a semiconductor substrate and are driven sequentially.

In the field of a solid-state image pickup device, an increase in the number of image pickup devices has recently been pursued up to the level of gigapixels or more. In association with an increase in the number of pixels, high-speed transfer of signal charges; i.e., driving of the charge transfer electrode by a high-speed pulse, is required, and hence demand exists for a decrease in the resistance of the charge transfer electrode. In the meantime, an increase in the size of a CCD sensor to, e.g., a Brownie (Trade Mark) size, is also pursued, and hence difficulty is encountered in maintaining high transfer efficiency at the time of transfer of electric charges.

Demand also exists for an increase in the transfer frequency of vertical CCDs with the view of preventing mixture of light into the vertical CCDs, to thereby reduce smear. To this end, a reduction in the resistance of the charge transfer electrode of the vertical CCDs is required in order to prevent occurrence of a false pulse and render a transfer pulse stable.

In response to these demands, related-art solid-state image pickup devices have adopted several methods; e.g., a method for increasing the thickness of a charge transfer electrode made of polycrystalline silicon, in order to diminish electrical resistance of the charge transfer electrode, and a method for increasing a doping level of dopants, such as phosphor or arsenic in polycrystalline silicon.

However, the thicker the film of the charge transfer electrode, the greater a step existing between the charge transfer electrode and a photoelectric conversion section such as a photodiode. Hence, an angle—at which a view of the light source is obtained from an aperture formed in the top of the photodiode—cannot be made wide, and therefore sufficient sensitivity fails to be attained.

A deterioration in flatness results in occurrence of variations in the thickness or geometry of various films such as a planarized film provided above the charge transfer electrode, an inner lens, a microlens, or a color filter. Consequently, shading, variations in sensitivity, and deterioration in smear due to stray light arise.

As mentioned above, demand for a reduction in the resistance of a film constituting the charge transfer electrode is ever-increasing. However, the resistivity of polycrystalline silicon to which dopants have been added up to the solubility limit assumes a value of 1000 $\mu\Omega$ cm or thereabouts, and hence a limitation is imposed on a reduction in resistance.

Therefore, the foregoing method encounters a problem of the difficulty in addressing a further increase in the number of pixels, an increase in the size of the solid-state image pickup device, and high-speed driving of the same.

To solve the problems, another proposed method for reducing electrical resistance of a charge transfer electrode is a structure in which a metal backing wire; that is, a so-called metal backing, is provided on a polycrystalline electrode (see JP-A-2001-223352).

When such a metal backing structure is used, a metal backing wire must be laid out with respect to the polycrystalline silicon electrode with an alignment margin. Hence, there arises a problem of a necessity for ensuring a wasted area corresponding to the alignment margin.

In the metal backing structure, a metal film, such as Al, Cu, or W, is used and connected to a charge transfer electrode after having been subjected to wiring processing. The density of defects, such as particles, in the metal film per se is higher than that of polycrystalline silicon. Therefore, the metal backing structure is likely to cause a problem in relation to yield, such as a short circuit in metal wiring.

When the metal film is subjected to patterning through photolithography during a process for subjecting the metal film to wiring, a step on the transfer electrode must inevitably be subjected to microprocessing. Hence, a variation in the width of a wiring pattern due to halation is likely to arise, raising a problem of difficulty in wiring.

A method for using a polycide structure in which polycrystalline silicon and silicide are stacked one on the other to reduce the resistance of the charge transfer electrode has already been proposed (see JP-A-63-46763).

After a pattern of charge transfer electrode has been formed through etching, the pattern is subjected to oxidation with the view of improving withstand voltage. A thermally-oxidated film of silicide constituting the polycide structure is lower in withstand voltage than the thermally-oxidated film formed by oxidizing polycrystalline silicon. Hence, there arises a problem of a reduction in withstand voltage between charge transfer electrodes, which in turn reduces yield.

To solve this problem, there has also been proposed a three-layered structure formed by containing a metal layer made of, for example Mo (molybdenum), in the polycrystalline silicon film. When pixel sizes have been made smaller, extreme difficulty is encountered in obtaining a metal-film-embraced structure without involvement of exposure of the metal layer from the polycrystalline silicon layer in all pixel areas and with superior reproducibility.

Even when an attempt is made to ensure a dielectric withstand voltage between transfer electrodes without involvement of oxidation in a polycide structure through use of a dielectric film CVD or the like, polycide is oxidized during a subsequent gate oxidated film formation process or during the course of heat processing to be performed at a high temperature (a temperature of 900° C. or higher) for activating dopants. Metal which constitutes diffused polycide and has a high melting point is captured into an oxide film existing between charge transfer electrodes, thereby deteriorating a dielectric withstand voltage.

There has also been proposed a method which is intended for ensuring a light-receiving area, reducing smear, and siliciding a charge transfer electrode through use of metal, such as molybdenum, after a polycrystalline silicon film has been patterned (see U.S. Pat. No. 5,202,282).

This methods enables a reduction in the resistance of the charge transfer electrode. However, this method is conceived with only a charge transfer electrode of single-layer structure in mind. There is a problem of inability to apply the method to a charge transfer electrode of two-layer structure.

In relation to the charge transfer electrode of multilayer structure, there is also conceivable a method for sequentially siliciding the electrode layers one after another. In relation to oxidation to be performed for improving withstand voltage between the charge transfer electrodes, a thermally-oxidated film to be formed has low dielectric withstand voltage as in the case of the previously-described charge transfer electrode of a polycide structure. Therefore, the method also suffers from a problem of an inability to improve yield.

Titanium silicide and cobalt silicide, which are used as an electrode material to be used for reducing resistance, have heat resistances of, at most, 700° C. to 850° C. or thereabouts. During the process for forming a gate oxide film of an upper electrode layer, the process of forming a charge transfer electrode, or the heating process for effecting activation during the process of forming a photodiode in a self-aligned manner through use of the ion implantation technique while the charge transfer electrode is taken as a mask, there arises a problem of occurrence of anomalous oxidation due to shortage of heat resistance, deterioration in a gate oxide film due to a coagulation reaction, or a hike in the resistance of a charge transfer electrode.

As mentioned above, a solid-state image pickup device in the related art has a problem of difficulty in reducing the resistance of a charge transfer electrode of a multilayer electrode structure and a problem of a reduction in yield associated with miniaturization and an increase in packing density.

SUMMARY OF THE INVENTION

The invention has been conceived in light of the circumstances and is aiming at providing a charge transfer element which does not cause any decrease in yield while ensuring a degree of freedom of a process even at the time of miniaturization of a charge transfer electrode, an increase in the number of pixels, or upsizing of a CCD using a charge transfer electrode formed from a plurality of layers.

The invention is also aimed at providing a method for manufacturing a solid-state image pickup device which is easy to manufacture and has high reliability.

To achieve the objects, the invention is characterized by a solid-state image pickup device having a charge transfer electrode of multilayer electrode structure, wherein a plurality of polycrystalline silicon electrode layers are formed; a sidewall dielectric film is interposed between sidewalls of the electrodes; and a silicide film is formed on the surface of a polycrystalline silicon film exposed from the sidewall dielectric film in a self-aligned manner.

Specifically, there is provided a solid-state image pickup device comprising a photoelectric conversion section formed on the surface of a semiconductor substrate and a charge transfer section having a charge transfer electrode for transferring electric charges produced by the photoelectric conversion section, wherein the charge transfer electrode of the charge transfer section comprises a first electrode layer comprising a silicon conductive film formed on a gate oxide film formed on the surface of the semiconductor substrate, a second electrode layer comprising a silicon conductive film formed on a gate oxide film between said first electrode layers, a sidewall dielectric film formed on sidewalls of the first and second electrode layers and a metal silicide film formed on the surfaces of the first and second electrode layers exposed from the sidewall dielectric film.

By means of such a configuration, a sidewall dielectric film is formed, in a self-aligned manner, on sidewalls of the ends of the electrodes, such as a space existing between the first and second electrode layers. Therefore, the electrodes can be separated from each other without fail even during the silicidation process, thereby preventing occurrence of a withstand voltage failure or a short circuit. Thus, a highly reliable solid-state image pickup device having low resistance can be formed.

If the second electrode layer is formed so as to sit astride and run on the first electrode layer via an interelectrode dielectric film from the gate oxide film, steps are formed on the surface even when the first and second electrode layers have the same thickness, and a sidewall dielectric film can be formed by utilization of the steps.

Since the sidewall dielectric film is formed in a self-aligned manner, an alignment margin is not necessary, and miniaturization and higher accuracy can be pursued.

Preferably, a doped polycrystalline silicon film is used as the silicon conductive film.

So long as the doped amorphous silicon film is used as a silicon conductive film, a necessity for a process of implanting dopants becomes obviated, and hence a highly reliable film that is easy to manufacture can be formed.

Further, if titanium silicide is used as the metal silicide film, an attempt can be made to reduce the resistance of the electrode further.

More preferably, if cobalt silicide is used as the metal silicide film, coagulation, which would be caused by heat in subsequent processes, is prevented. Hence, a silicide film having much lower resistance can be formed.

Nickel silicide, palladium silicide, platinum silicide, or tantalum silicide may be used as the metal silicide film.

In addition, titanium, cobalt, nickel, palladium, platinum, tantalum, or nitrides, alloys, compounds, and composites thereof are added to the top of the metal silicide layer, thereby yielding the effect of preventing an increase in the resistance of the electrodes, which would otherwise be caused by coagulation of a lower layer.

A method of the invention is a method for manufacturing a solid-state image pickup device comprising a photoelectric conversion section, and a charge transfer section having a charge transfer electrode for transferring electric charges produced by the photoelectric conversion section, the method comprising a process for forming, on the surface of the semiconductor substrate having the photoelectric conversion section formed thereon, a first electrode layer comprising a silicon conductive film via a gate oxide film and a second electrode layer comprising a silicon conductive film via the gate oxide film existing between the first electrode layers, a process for forming a dielectric film so as to cover the entirety of the semiconductor substrate, a process for selectively removing the dielectric film by means of anisotropic etching, to thereby form a sidewall dielectric film on sidewalls of the first and second electrode layers, a process for forming a metallic film on top of the sidewall dielectric film, a silicidation process for forming metal silicide on a boundary surface between the first and second electrode layers exposed from the sidewall dielectric film and the metal film, by means of heat treatment and a process for selectively removing a metal film which has remained non-silicidated, thereby forming a charge transfer electrode comprising a silicon conductive film and a metal silicide film.

By means of such a configuration, a sidewall dielectric film is formed in a self-aligned manner. Subsequently, a silicide film is formed in a self-aligned manner on the surface of the silicon conductive film exposed from the sidewall dielectric film. Hence, the resistance of the electrode can be reduced without being affected by a misalignment which would arise during a photolithography process or halation derived from surface reflection unique to a metallic material. Here, steps are preferably formed on the surfaces of the first and second electrode layers.

If the second electrode layer is formed so as to sit astride and run on the first electrode layer via an interelectrode dielectric film from the top of the gate oxide film, steps are formed on the surface even when the first and second electrode layers have the same thickness, and the sidewall dielectric film can be formed by utilization of the steps.

Ends of the silicon conductive film are covered with a sidewall dielectric film, and adjacent electrodes are separated from each other. Even when a protuberance has arisen at the time of silicidation, a silicide film can be formed in a self-aligned manner without involvement of occurrence of a short circuit. Here, the term "protuberance" means so-called lateral growth of silicide. Namely, in a case where silicide is produced as a result of silicon spreading into a metal film, after all silicon-exposed areas have been changed to silicide, silicon spreads into surrounding metal and silicidation proceeds, thereby causing lateral growth. The thus-grown silicide further extends along the sidewall dielectric film. Such a laterally-grown silicide is called a protuberance.

Further, a photolithography process and an etching process, which are required for forming a low-resistance layer such as a metal layer, become unnecessary, thereby enabling an improvement in a yield attributable to a reduction in the number of processes.

As mentioned above, the only requirement is to use a photolithography process during the process for patterning the silicon conductive film and the interelectrode dielectric film. A sidewall dielectric film is formed at the ends of the pattern, and the substrate is subjected to heat treatment while a metal film is formed on top of the sidewall dielectric film. A metal silicide film is formed in a self-aligned manner, thereby enabling easy formation of a charge transfer electrode of low resistance.

Further, the process for forming a silicon conductive film includes a process for forming a polycrystalline silicon film and a process of doping the polycrystalline silicon film with dopants.

Further, the process for forming the silicon conductive film includes a process for forming an amorphous silicon film while dopants are being added.

Moreover, if at least the photoelectric conversion section is covered with a resist pattern prior to the anisotropic etching, areas where no silicide is to be formed, such as peripheral circuit areas, are protected and covered with resist.

The method may further comprise an annealing process for reducing the resistance of the metal silicide film by means of heat treatment, wherein the process for selectively removing the metal film is followed by the annealing process.

The silicidation process is preferably a process for performing heating operation in a nitrogen atmosphere of 690° C. to 800° C.

If the substrate is heated to 800° C. or higher after removal of the metal film that has remained non-silicidated, an attempt can be made to reduce the resistance of the silicide film.

BRIEF DESCRIPTION OF THE DRAWINGS

FIG. 6 is a comparative chart showing results of measurement of resistance of the charge transfer electrode of the embodiment and results of measurement of resistance of the related-art charge transfer electrode.

DETAILED DESCRIPTION OF THE INVENTION

Embodiments of the invention will be described hereinbelow by reference to the drawings.

(First Embodiment)

Figure 1:
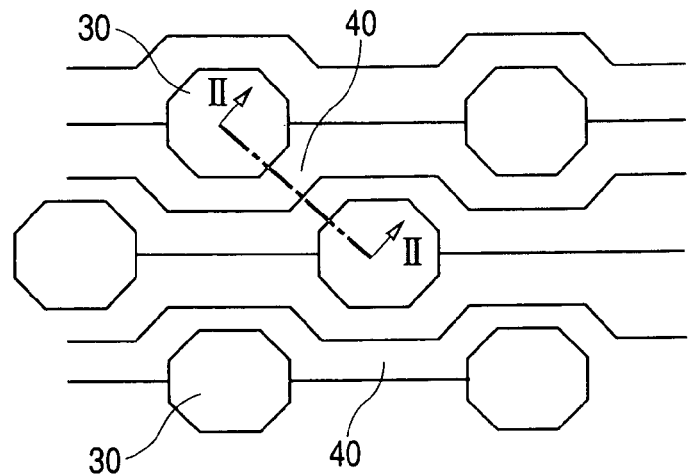
FIG. 1 is a view showing a solid-state image pickup device according to a first embodiment of the invention.

FIG. 1 shows a schematic configuration of a solid-state image pickup device according to a first embodiment of the invention. FIG. 1 is a schematic plan view showing an area starting from a photoelectric conversion section to a charge transfer section, and FIG. 2 is a cross-sectional view taken along line II—II shown in FIG. 1.

Figure 2:
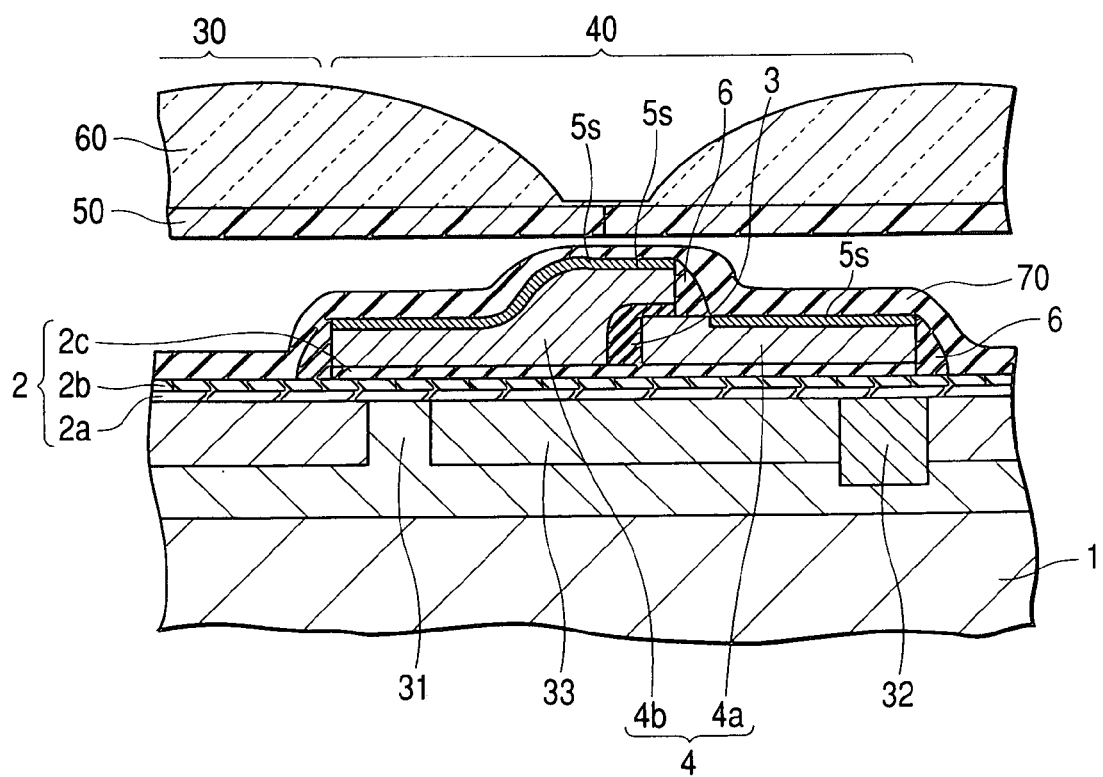
FIG. 2 is a cross-sectional view showing the solid-state image pickup device of the first embodiment.

As can be seen from a cross-sectional view of a principal section shown in FIG. 2, the solid-state image pickup device has a charge transfer electrode 4 of a two-layer structure provided on the surface of a silicon substrate 1 (semiconductor substrate) in which a desired element region is formed. The charge transfer electrode 4 is formed from a first electrode layer 4a arranged and made of polycrystalline silicon by way of a gate oxide film 2 and a second electrode layer 4b which is made of polycrystalline silicon so as to sit astride and run on the first electrode layer 4a from the gate oxide film 2. End sections of the first and second electrode layers 4a, 4b are separated from each other by way of a sidewall dielectric film 6. A titanium silicide film 5S (metal silicide film) is formed on the surfaces of the first and second electrode layers 4a, 4b, which are exposed from the sidewall dielectric film 6, in a self-aligned manner, in an attempt to reduce the resistance of the charge transfer electrode. Thus, there is formed a solid-state image pickup device which is free from withstand voltage failure or a short circuit.

The gate oxide film comprises a three-layer structure film comprising a silicon oxide film 2a, a silicon nitride film 2b, and a silicon oxide film 2c.

As can be seen from the cross-sectional view of the principal section of the charge transfer section shown in FIG. 2, in the solid-state image pickup device, the charge transfer electrode 4 of a two-layer structure is arranged and formed on the surface of the silicon substrate 1 having a desired element region formed therein, by way of the gate oxide film 2. The charge transfer electrode 4 is constituted of the first and second electrode layers 4a, 4b having side-wall dielectric films 6 as well as of the titanium silicide film 5S. The titanium silicide film 5S is formed in a self-aligned manner by means of forming a titanium film over the first and second electrode layers 4a, 4b, silicidizing the titanium film, and selectively removing the titanium film that has been left unsilicidized.

An interelectrode dielectric film 3 is formed through photolithography after formation of the first electrode layer 4a.

As shown in FIG. 2, a plurality of photodiodes 30 (photoelectric conversion section) are fabricated in the silicon substrate 1. A charge transfer section 40 to be used for transferring signal charges detected by the photodiode 30 is formed so as to run between the photodiodes 30 in a meandering pattern.

Although not shown in FIG. 1, a charge transfer channel 31—through which signal charges to be transferred by a charge transfer electrode migrate—is formed so as to run in a direction intersecting the direction in which the charge transfer section 40 extends, also in a meandering manner.

Portions of the interelectrode dielectric film 3, which are formed in the vicinity of a boundary between the photodiode area and the charge transfer section 40, are omitted from FIG. 1.

As shown in FIG. 2, the photodiodes 30, the charge transfer channels 31, channel stop regions 32, and charge read regions 33 are formed within the silicon substrate 1, and the gate oxide film 2 is formed on the surface of the silicon substrate 1. The interelectrode dielectric film 3 formed from a silicon oxide film and the charge transfer electrode (consisting of the first electrode layer 4a, the second electrode layer 4b, and the titanium silicide film 5S) is formed on the surface of the gate oxide film 2.

The charge transfer section 40 is as mentioned previously. A silicon oxide film 70 serving as an interlayer dielectric film is formed on top of the titanium silicide film 5S of the charge transfer section 40.

A light-shielding film (not shown) is provided above the solid-state image pickup device so as to avoid the areas corresponding to the photodiodes 30. Further, a color filter 50 and microlenses 60 are provided. A space existing between the charge transfer section 40 and the light-shielding film and a space existing between the light-shielding film and the color filter 50 are filled with dielectric transparent resin or the like. The solid-state image pickup is analogous to a commonly-used solid-state image pickup exclusive of the charge transfer section 40 and the interelectrode dielectric film 3, and hence explanations of the analogous portions are omitted. Further, FIG. 1 shows a solid-state image pickup device of so-called honeycomb structure. Needless to say, the invention can also be applied to a solid-state image pickup device of square grid type.

Processes for manufacturing a solid-state image pickup device will now be described.

A silicon oxide film having a thickness of 15 nm, a silicon nitride film having a thickness of 50 nm, and a silicon oxide film having a thickness of 10 nm are formed on the surface of the n-type silicon substrate 1, to thereby form the gate oxide film 2 of three-layer structure.

Subsequently, a first polycrystalline silicon film layer having a thickness of 0.4 $\mu$m is formed on the gate oxide film 2 by means of the low pressure CVD technique which uses as a reactive gas $SiH_4$ diluted with He. The temperature of the substrate achieved at this time is set to 600° C. to 700° C. The substrate is subjected to heat processing at a temperature of 900° C. in an atmosphere of a gas mixture consisting of $POCL_3$, $N_2$, and $O_2$, thereby doping the first polycrystalline silicon layer (phosphoric acid processing).

Positive resist is applied over the first polycrystalline silicon layer to a thickness of 0.5 $\mu$m to 1.4 $\mu$m.

The substrate is then exposed through use of a desired mask by means of photolithography. The thus-exposed substrate is then developed and rinsed, to thereby form a resist pattern having a width from 0.3 $\mu$m to several micrometers.

Subsequently, the first polycrystalline silicon layer is selectively etched, by means of reactive ion etching using a gas mixture consisting of HBr and $O_2$ while the resist pattern is used as a mask and the gate oxide film 2 is used as an etch stopper. Subsequently, the resist pattern is removed, to thereby make the first electrode layer 4a. Here, an ECR or ICP etching system is preferably used.

Subsequently, the interelectrode dielectric film 3 is formed from a silicon oxide film having a thickness of 80 nm on the surface of the first electrode layer 4a, through thermal oxidation.

The interelectrode dielectric film 3 is formed in this manner.

The second polycrystalline silicon layer is formed to a thickness of 0.4 $\mu$m to 0.7 $\mu$m by means of the low pressure CVD technique using a $SiH_4$ gas. As in the case of the first polycrystalline silicon layer, the second polycrystalline silicon layer is patterned through photolithography, to thus form the second electrode layer 4b. Here, the second polycrystalline silicon layer is subjected to phosphor acid processing as in the case of the first polycrystalline silicon layer.

Figure 3A:
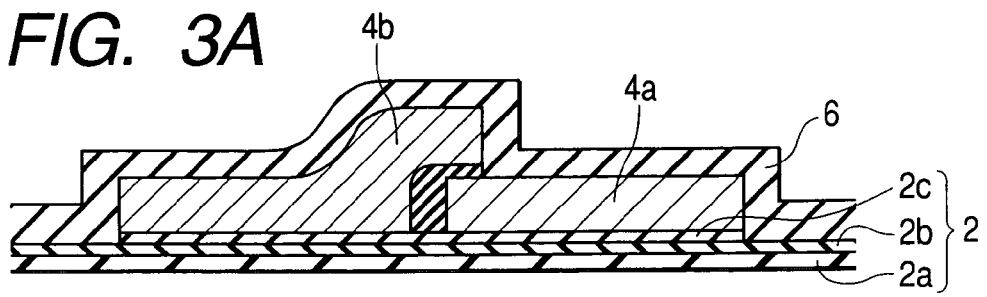
FIG. 3 is a view showing processes for manufacturing the solid-state image pickup device of the first embodiment.

As shown in FIG. 3A, the silicon oxide film 6 is formed on the first polycrystalline silicon layer 4a, the interelectrode dielectric film 3, and the second polycrystalline silicon layer 4b by means of the low pressure CVD technique.

Figure 3B:
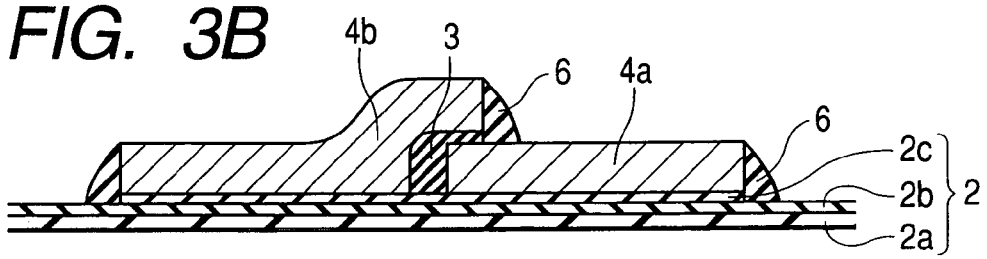

As shown in FIG. 3B, the polycrystalline silicon films of the first and second electrodes 4a, 4b are exposed by means of anisotropic etching. Further, the silicon oxide film 6 is left on the sidewalls of the first and second electrode layers 4a, 4b. The width of the sidewall dielectric film can be controlled by means of the thickness of the silicon oxide film. The greater the thickness of the silicon oxide film, the wider the width of the sidewall dielectric film, thereby broadening a short circuit margin between adjacent electrodes. When the silicon oxide films of the first and second electrodes assume a thickness of 160 nm, the sidewall dielectric film assumes a width of 160 nm. The silicon oxide film is formed by means of the low pressure CVD technique. However, the silicon oxide film may be a thermally-oxidated film or a multilayer structural body consisting of a thermally-oxidated film and a silicon oxide film formed by the CVD technique.

When necessary, high-temperature processing (at a temperature of 900° C. or higher), such as heat processing for activating dopants, has been performed prior to at least the next sputtering process.

In the present embodiment, gate oxidization and formation of the insulating film between the first polycrystalline silicon layer and the second polycrystalline silicon layer has already been completed, and high-temperature processing related to that process has already been completed.

Formation of the first and second layer electrodes has already been completed, and hence dopants are introduced in a self-aligned manner by means of ion implantation while the electrodes are used as a mask, and activation of the thus-introduced dopants can also be carried out.

As a result, prevention of deterioration of silicide to be formed in a subsequent process and high-temperature processing required in terms of an element characteristic can be integrated together without involvement of a contradiction.

Figure 3C:
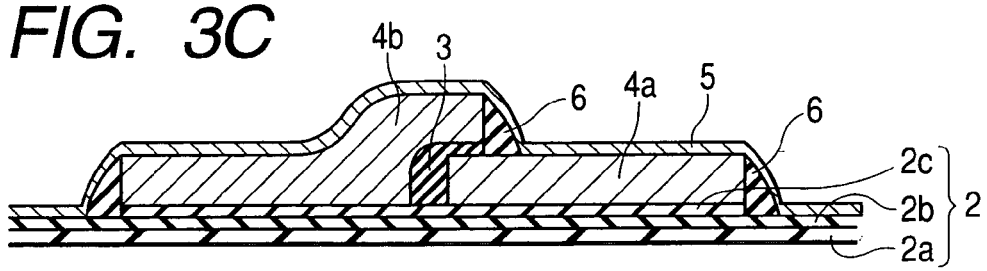

As shown in FIG. 3C, the titanium film 5 having a thickness of 50 nm to 300 nm is formed on the polycrystalline silicon film constituting the first and second electrode layers 4a, 4b, by means of sputtering.

Before sputtering of the titanium film, the polycrystalline silicon film is subjected to sputter etching by means of argon plasma in a sputtering system, to thereby remove a naturally-oxidated film from the surface of the polycrystalline silicon film. Subsequently, the titanium film 5 is continuously subjected to sputtering without being exposed to the atmosphere, thereby stably reducing resistance.

Figure 3D:
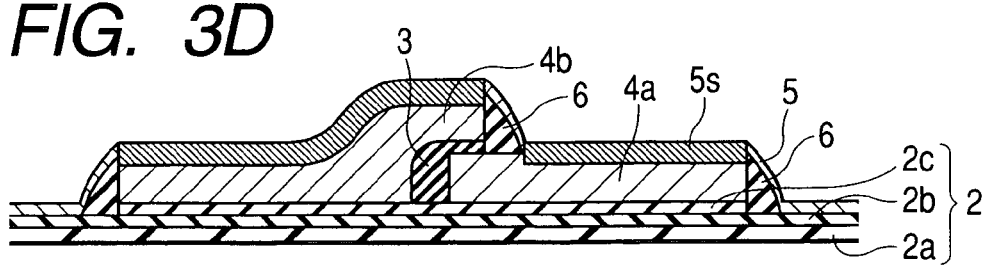

As shown in FIG. 3D, the substrate is subjected to RTA (rapid thermal annealing) for 90 seconds at 760° C., to thereby simultaneously form the titanium silicide film 5S at the boundary between the polycrystalline silicon films of the first and second electrode layers 4a, 4b and the titanium film 5. A heating temperature optimal for silicidating the polycrystalline silicon doped with phosphor up to a degeneration level is 760° C.

N+ polycrystalline silicon, such as that which is described in connection with this embodiment and undergoes silicidation reaction at a slower speed than does p+ polycrystalline silicon, is less likely to cause a protruding portion, which would otherwise be caused by silicidation. Priority is given to a reduction in resistance, and n+ polycrystalline silicon can be heated at 760° C. or higher.

Silicidation cannot be performed sufficiently at as low as 720° C., for reasons of slow silicidation reaction. A silicide layer on the transfer electrode becomes dissolved during the course of a subsequent nonreacted titanium removal process, thereby resulting in an increase in resistance rather than a decrease.

At this time, polycrystalline silicon and titanium react with each other only on the first and second electrodes. Hence, the titanium left on the photodiodes coated with the sidewall dielectric film 6 and that left on peripheral circuits coated with the dielectric film remain nonreacted. The titanium silicide has a C-49 crystal structure. The specific resistance of the charge transfer electrode constituted of the first and second electrode layers 4a, 4b is considerably high.

Figure 3E:
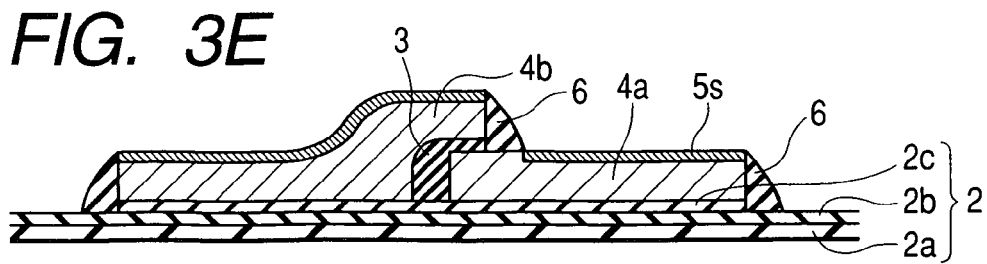

As shown in FIG. 3E, the substrate is subjected to SC-1 processing which uses a mixture consisting of ammonia and hydrogen peroxide, to thereby remove the nonreacted titanium film. Thus, an attempt is made to reduce the resistance of titanium silicide by way of an annealing process at 800° C. for 90 seconds, thereby forming a charge transfer electrode of two-layer structure consisting of a polycrystalline silicon film and titanium silicide.

After a P-TEOS film has been formed on the charge transfer electrode to a thickness of 100 nm, a BPSG film is formed to a thickness of 700 nm. The substrate is subjected to reflow and planarization processing at 850° C., to thus form the silicon oxide film 70 (dielectric film). Subsequently, a light-shielding film, the color filter 50, and the microlenses 60 are formed, to thus form a solid-state image pickup device such as that shown in FIG. 1.

According to this method, a sidewall dielectric film is formed on sidewalls of the polycrystalline silicon film constituting the first and second electrode layers. A titanium silicide film is formed on the surface of the polycrystalline silicon film exposed from the sidewall dielectric film, and hence withstand voltage failures and a short circuit failure do not arise. Consequently, a fine, highly-reliable solid-state image pickup device can be obtained.

Patterning of a metal film—which has high surface reflectance and is hard to process for reasons of halation—is obviated. Specifically, a pattern of a polycrystalline silicon film is formed without involvement of a decrease in accuracy, which would otherwise be caused by influence of surface reflection. Edges are covered with a sidewall dielectric film, and silicidation is effected on only the pattern, to thereby selectively form a metal silicide film. As a result, a charge transfer electrode of two-layer structure can be formed in a self-aligned manner. A charge transfer electrode of two-layer structure is silicidated through one silicidation process. Hence, the number of high-temperature processes can be reduced. Accordingly, there can be formed a solid-state image pickup device possessing a highly accurate, highly reliable charge transfer electrode, without involvement of misalignment of a mask.

Occurrence of contact of metal with an exposed silicon surface when the silicon surface is exposed at the time of formation of a photodiode becomes a cause of contamination. This embodiment employs only one operation for forming a metal film and one heat processing operation for effecting silicidation and does not need two or more operations. Further, use of RTA involves consumption of only a short period of time. Hence, even when an attempt is made to form an electrode after formation of a photodiode, a high-quality solid-state image pickup device can be formed with involvement of a small misalignment between mating surfaces due to extension of a diffusion length. Accordingly, there can be prevented contamination of a photodiode, which would otherwise be caused by metal ions, thus improving reliability.

N-type polycrystalline silicon having a thickness of 400 nm usually has a sheet resistance of 20 $\Omega/\text{cm}^2$. However, in the embodiment, when titanium having a thickness of 120 nm is formed through sputtering, an attempt can be made to reduce, to 2 $\Omega/\text{cm}^2$, the resistance of a transfer electrode having a width of 1 $\mu$m.

In the honeycomb CCD of the embodiment, the transfer electrode can be constituted into a two-layer electrode structure even in the case of an all-pixel reading method. A silicide layer can be formed continuously in a longitudinal direction of the electrode without being interrupted by a transfer electrode of another phase. Therefore, the resistance of a transfer electrode can be reduced over the entire length thereof in a longitudinal direction thereof. Further, the transfer electrode is uniformly silicidated, and hence a potential variation, which would otherwise arise a charge transfer path because of a change in the work function of an electrode material, does not arise. Hence, occurrence of a rise in the resistance of an electrode of a portion that has not been silicidated is prevented.

The embodiment has employed a process of subjecting the substrate to RTA at 760° C. for about 90 seconds, to thereby temporarily obtain a C49 structure; subjecting the substrate to SC-1 processing, to thereby remove a titanium film from an unwanted portion; and further subjecting the substrate to heat processing at 800° C. for 90 seconds or thereabouts, to thereby obtain a silicide film of C54 structure and reduce the resistance of the electrode. However, the temperature of heat processing to be performed for effecting silicidation is set to 800° C., to thereby form a titanium silicide film of C54 structure at a stroke. The thus-formed titanium silicide film is stable and has low resistance (specific resistance of 15 $\Omega\cdot\text{cm}$).

A rise in a transfer electrode, which would be caused by coagulation reaction of titanium silicide, is not observed. The reason for this is considered to be that the titanium silicide film is formed without involvement of a high-temperature, long-duration heat processing process.

In the embodiment, the sidewall dielectric film is formed on the ends of the first and second electrode layers, and only the surfaces of the first and second electrode layers exposed from the sidewall dielectric film are selectively silicidated. Hence, even when the temperature required to effect silicidation is set to 800° C., to thereby form a titanium silicide film of C54 structure at a stroke, the presence of the sidewall dielectric film enables maintenance of high reliability without involving occurrence of a short circuit between electrodes.

In the embodiment, formation of a P-TEOS film is followed by formation of a BPSG film. However, a tungsten film serving as a light-shielding film may be formed prior to formation of the BPSG film.

In addition to titanium silicide, tantalum silicide, tungsten silicide, molybdenum silicide, nickel silicide, cobalt silicide, platinum silicide, and the like can be employed as the metal silicide film employed in the embodiment. Nitride, an alloy, a compound or a composite of titanium, tantalum, tungsten, molybdenum, nickel, cobalt or platinum may further be formed on the metal silicide.

The embodiment can be applied to both a vertical transfer electrode and a horizontal transfer electrode.

(Second Embodiment)

A second embodiment of the invention will now be described. In the first embodiment, the substrate is subjected to anisotropic etching without formation of a mask at the time of formation of a sidewall dielectric film. In contrast, this embodiment is characterized in that the photodiodes and the peripheral circuits thereof are covered with the photoresist, thereby exposing only an area whose resistance is to be lowered. The thus-exposed area is silicidated.

Like areas are assigned like numerals.

Figure 4A:
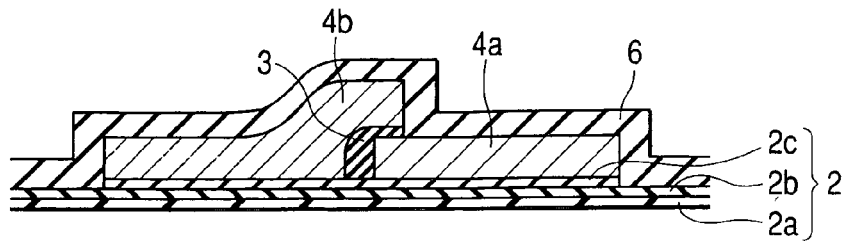
FIG. 4 is a view showing processes for manufacturing the solid-state image pickup device of the second embodiment.

The silicon oxide film 6 is formed on the first and second electrode layers 4a, 4b formed in the same manner as in the first embodiment, by means of low pressure CVD technique (FIG. 4A).

Figure 4B:
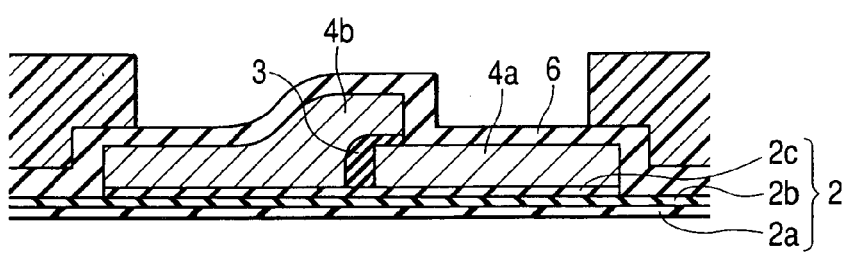

Unillustrated photodiodes and peripheral circuits are coated with photoresist, to thus expose the first and second electrode layers, which are formed from first and second polycrystalline silicon films, and the area whose resistance is desired to be lowered (FIG. 4B).

Figure 4C:
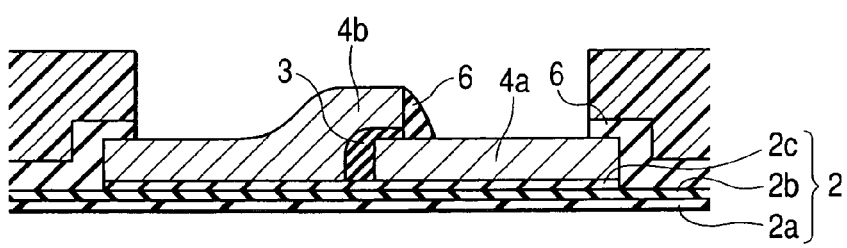

In this state, the silicon oxide film 6 is left on the sidewalls of the first and second electrode layers 4a, 4b by means of anisotropic etching, and the polycrystalline silicon film of the first and second electrode layers is exposed (FIG. 4C). In this process, adjacent charge transfer electrodes are isolated from each other in a self-aligned manner by means of the sidewall dielectric film. Therefore, there is no necessity for partitioning and patterning adjacent charge transfer electrodes during the photolithography process.

Specifically, the areas that must be patterned during the photolithography process are only the areas susceptible to a rule of width comparatively less strict than that applied to a pixel area; that is, photodiodes and peripheral circuits. Miniaturization of CCDs can be addressed comparatively.

At this time, all ONO films constituting the gate oxide film 2 formed on the surface of the silicon substrate may be etched. Alternatively, this silicon nitride film may be employed as an etch stopper.

Figure 4D:
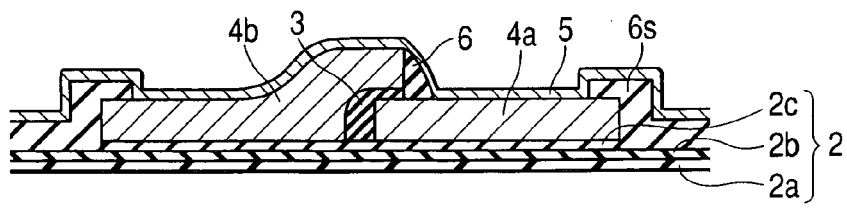

As shown in FIG. 4D, the titanium film 5 is formed to a thickness of 60 nm on the surface of the polycrystalline silicon film constituting the first and second electrode layers 4a, 4b, by means of the PVD technique.

Figure 4E:
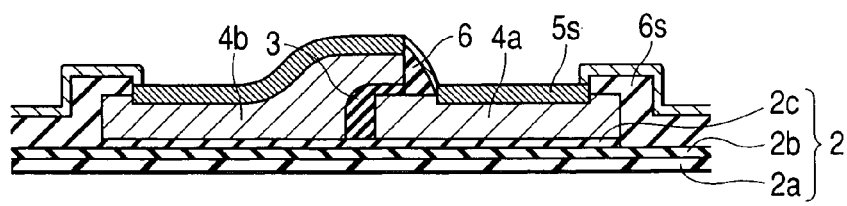

As shown in FIG. 4E, the titanium silicide film 5S is simultaneously formed in a boundary surface between the polycrystalline silicon film of the first electrode layer 4a and the titanium film 5 and a boundary surface between the polycrystalline silicon film of the second electrode layer 4b and the titanium film 5, in a nitrogen atmosphere at a temperature of 690° C. to 800° C. by means of annealing through use of a halogen lamp.

Figure 4F:
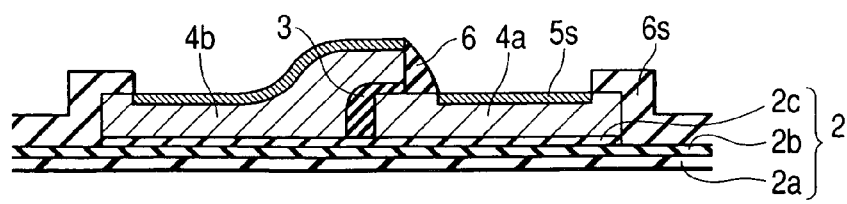
Figure 5:
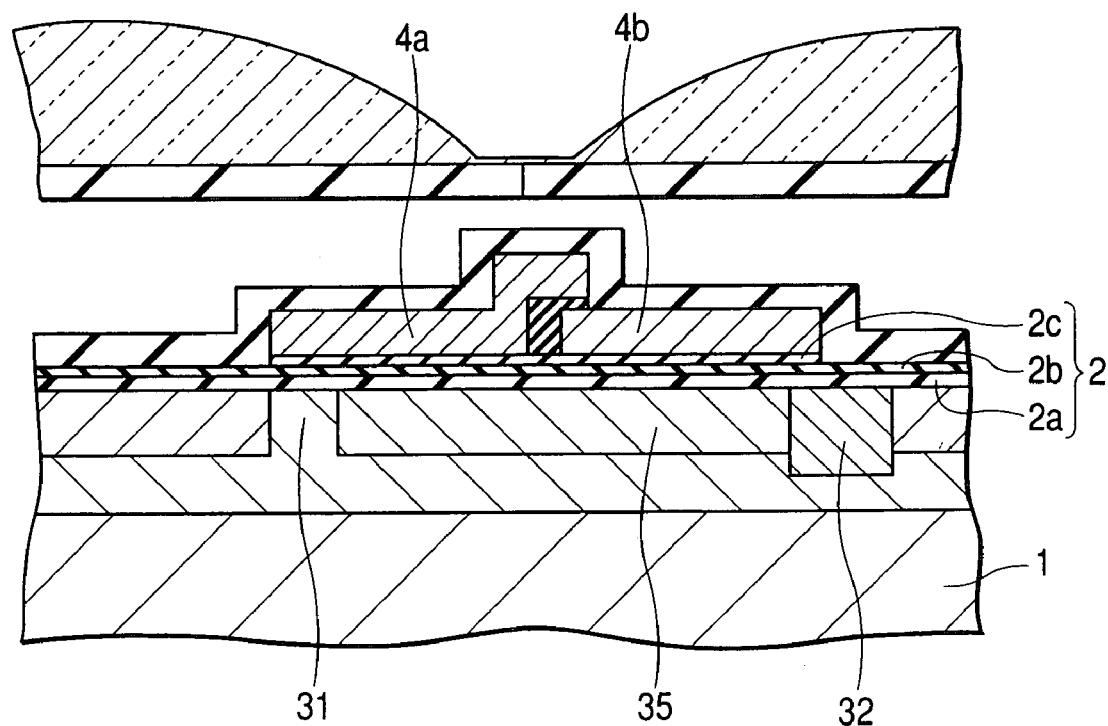
FIG. 5 is a view showing a related-art solid-state image pickup device.

As shown in FIG. 4F, the substrate is then subjected to SC-1 processing through use of a mixture consisting of ammonia and hydrogen peroxide, thereby removing a non-reacted titanium film. An attempt is made to reduce the resistance of titanium silicide by way of an RTA annealing process that is performed at 800° C. for 90 seconds. As a result, the charge transfer section 40 having a charge transfer electrode of two-layer structure; that is, a polycrystalline silicon film and titanium silicide, is formed.

After the P-TEOS film has been formed on the charge transfer section 40 to a thickness of 100 nm in the same manner as in the first embodiment, the BPSG film is formed to a thickness of 700 nm. The film is then subjected to reflow and planarization processing at 850° C., to thereby form the dielectric film 70. Subsequently, the light-shielding film, the color filters 50 and the microlenses 60 are formed, to thus produce a solid-state image pickup device such as that shown in FIG. 1.

A sidewall dielectric film is formed between the first polycrystalline silicon layer constituting the first electrode layer and the second polycrystalline silicon layer constituting the second electrode layer, by means of anisotropically etching a silicon oxide film. This sidewall dielectric film prevents occurrence of a short circuit between polycrystalline silicon films. When the thickness of the silicon oxide film is increased, the width of a sidewall is also increased, thereby resulting in an increase in a short circuit margin between adjacent electrodes.

This method also enables formation of a charge transfer electrode free of a withstand voltage failure, as in the case of the first embodiment.

According to the method, when a pattern of dielectric film which is to serve as an interelectrode dielectric film is formed, the dielectric film formed on the sidewall of a dummy pattern is left on the sidewall by means of anisotropic etching. As a result, a fine, highly reliable interelectrode dielectric film is readily formed.

RTA employed as the first annealing process for silicidation purpose in the embodiments is performed at 700° C. for 90 seconds. However, an arbitrary temperature and duration can be employed, so long as they fall within the range of 650° C. to 750° C. and the range of 30 to 120 seconds. Here, the titanium silicide film assumes a C49 structure.

Finally, heat treatment falling within the temperature range of 750° C. to 850° C. and the duration range of 30 to 120 seconds is performed as the second annealing process, thereby imparting a C54 structure to the titanium silicide film. Thus, an attempt can be made to reduce the resistance of the charge transfer electrode.

Even in the second embodiment, heat treatment can be performed by a single operation during a single annealing process (falling within the temperature range of 750 to 850° C. and for 30 to 120 seconds), thereby imparting a C54 structure to the titanium silicide film. In this case, the protuberance is more likely to arise. However, the upper end of the polycrystalline silicon film is formed sufficiently lower than the upper end of the interelectrode dielectric film, thereby preventing occurrence of a withstand voltage failure or a short circuit.

In the embodiment, silicide is formed by means of interface reaction between a polycrystalline silicon film and a metal film. However, the film is not limited to a polycrystalline silicon film. Any film may be employed, so long as the film is a silicon conductive film such as amorphous silicon or microcrystal silicon.

COMPARATIVE EXAMPLE

In a comparative example, a dielectric film 6S existing between the first polycrystalline silicon layer and the second polycrystalline silicon layer is patterned and formed through photolithography in lieu of the sidewall dielectric film that is formed from a remaining sidewall by utilization of steps formed on the surfaces of the first and second polycrystalline silicon film layers.

Figure 7A:
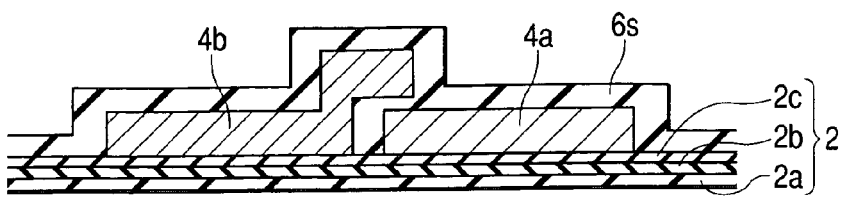
FIG. 7 is a view showing processes for manufacturing a solid-state image pickup device of a comparative example.

The silicon oxide film 6 is formed on the first and second electrode layers 4a, 4b that have been formed in the same manner as in the first and second embodiments, by means of the low CVD technique (FIG. 7A).

Figure 7B:
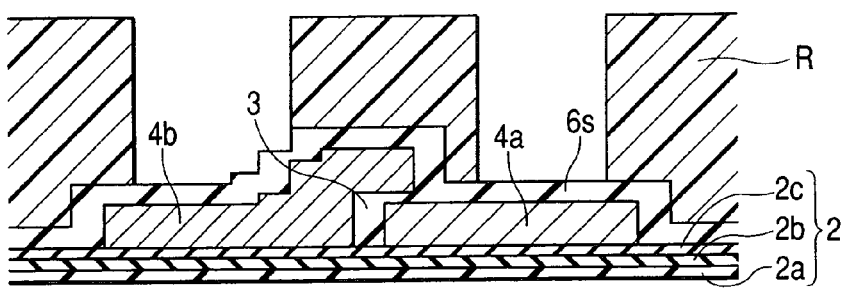

The resist R is patterned through photolithography, and unillustrated photodiodes, unillustrated peripheral circuits, and the area existing between the first and second electrode layers are covered with photoresist. Openings are formed, in the longitudinal direction, in the first and second electrode layers that are formed from the first and second polycrystalline silicon films (FIG. 7B). The width of the openings must be determined with alignment margins for photolithography and etching required during manufacturing processes so that the openings can be stably formed in the transfer electrode. If an alignment margin for each opening is 0.1 μm, the width of the transfer electrode is eventually narrowed by 0.2 μm. On the assumption that the transfer electrode has a width of 0.5 μm, openings can be formed up to only about 40% of the entire surface of the substrate.

Figure 7C:
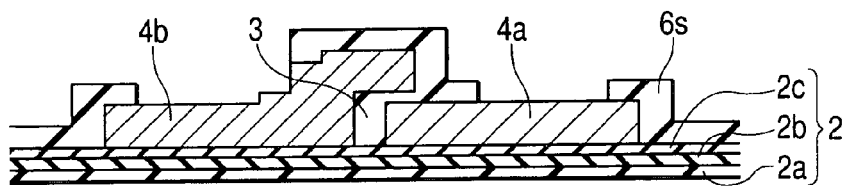

In this state, portions of the surfaces of the polycrystalline silicon film of the first and second electrode layers are exposed by means of anisotropic etching with the resist R being taken as a mask (FIG. 7C).

At this time, all the ONO film constituting the gate oxide film 2 formed on the surface of the silicon substrate may be etched. Alternatively, this silicon nitride film may be used as an etch stopper.

Figure 7D:
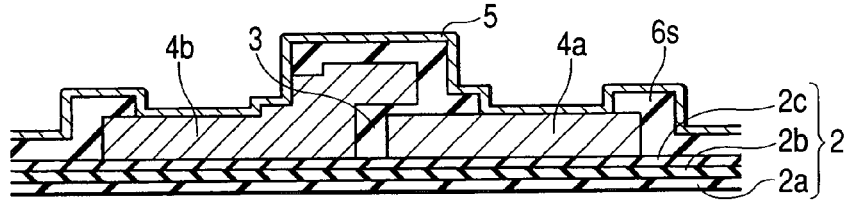

As shown in FIG. 7D, the titanium film 5 is formed on the polycrystalline silicon film constituting the first and second electrode layers 4a, 4b to a thickness of 60 nm by means of the PVD technique, as in the case of the embodiment.

Figure 7E:
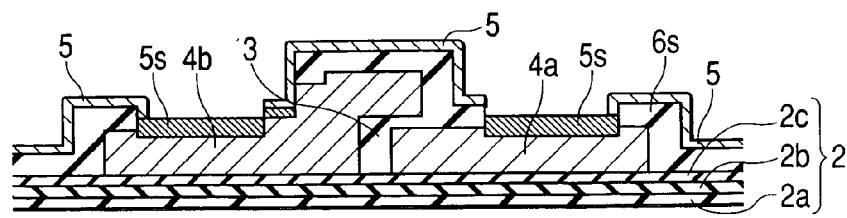

As shown in FIG. 7E, the titanium silicide film 5S is simultaneously formed in the boundary surface between the polycrystalline silicon film of the first electrode layer 4a and the titanium film 5 and the boundary surface between the polycrystalline silicon film of the second electrode layer 4b and the titanium film 5, in a nitrogen atmosphere at a temperature of 690° C. to 800° C. by means of annealing through use of a halogen lamp. Polycrystalline silicon and titanium react with each other by way of only this opening, whereby the titanium left on the photodiodes and the source-drain regions of the peripheral circuits, both being covered with an oxide film, remain nonreacted.

Figure 7F:
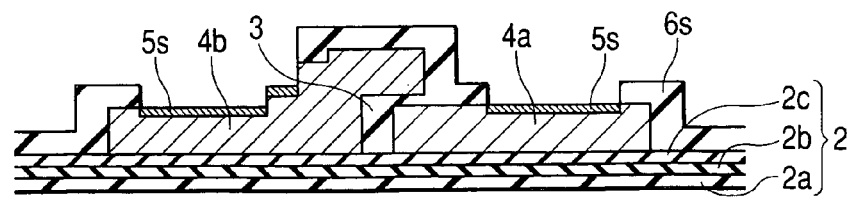

As shown in FIG. 7F, the substrate is then subjected to SC-1 processing through use of a mixture consisting of ammonia and hydrogen peroxide, thereby removing a non-reacted titanium film. The substrate is again subjected to the annealing process at 800° C. for 90 seconds through use of the RTA technique, thereby transferring the phase of titanium silicide into a C54 phase in an attempt to reduce resistance. As a result, the charge transfer section 40 having a charge transfer electrode of two-layer structure; that is, a polycrystalline silicon film and titanium silicide, is formed.

Here, FIG. 6 shows results of measurement of a resistance value and a wiring resistance ratio of the charge transfer electrode formed under the method described in connection with the embodiments and results of measurement of a resistance value and a wiring resistance ratio of mere polycrystalline silicon. Here, a curve "a" denotes results of measurement of the charge transfer electrode described in connection with the second embodiment of the invention. As can be seen from the comparative example to be described below, a curve "b" denotes results of measurement of the charge transfer electrode described in connection with the comparative example, wherein the dielectric film 6S is formed between the first and second polycrystalline silicon layers through photolithography. A curve "c" denotes results of measurement of mere polycrystalline silicon.

As is evident from the drawings, an effect derived from silicidation has become reduced under the method of the comparative example. The reason for this is that the resistance of the transfer electrode can be reduced by means of silicidation up to a width determined by subtracting an alignment margin in the draft required during an opening formation process from the width of the transfer electrode.

As mentioned above, according to the invention, a reduction in resistance derived from silicidation is effective. In contrast, the openings are formed through photolithography in the comparative example. Hence, the effect of a reduction in resistance becomes reduced in association with a reduction in the width of the transfer electrode.

As has been described above, the solid-state image pickup device of the invention enables provision of a solid-state image pickup device having a highly reliable charge transfer electrode of low resistance.

According to the invention, a silicide layer is continuously formed in a longitudinal direction of the charge transfer electrode without being interrupted by a transfer electrode of another phase, and hence the resistance of the transfer electrode can be reduced over the entire longitudinal length thereof. Since the transfer electrode is silicidated uniformly, variations in the potential of the charge transfer path, which would otherwise be caused by a change in the work function of an electrode material, do not arise, and neither does an increase in the resistance of a non-silicidated portion of the electrode.

Accordingly, there can be provided a solid-state image pickup device which can effect high-speed transfer and involves low power consumption.

The height of the electrode can be made much lower by means of a reduction in the resistance of the charge transfer electrode, and the surface of the electrode can be made flat. Therefore, an attempt can be made to improve sensitivity of the image pickup device and reduce an eclipse.

Further, high-speed transfer becomes feasible, and hence the optical characteristic of the solid-state image pickup device, such as smear, can be improved. Thus, a high-quality, highly reliable solid-state image pickup device can be obtained.

According to the method for manufacturing the solid-state image pickup device of the invention, a low-resistance layer can be formed in a self-aligned manner. Hence, an attempt can be made to reduce the resistance of the electrode without being affected by the influence of halation derived from a misalignment during a photolithography process or surface reflection unique to a metallic material. Further, an attempt can be made to improve a yield by reducing the number of processes as a result of obviation of a necessity for the photolithography process and the etching process as well as to shorten a manufacturing period and reduce manufacturing costs.

What is claimed is:

1. A solid-state image pickup device comprising:
a photoelectric conversion section formed on the surface of a semiconductor substrate; and
a charge transfer section having a charge transfer electrode for transferring electric charges produced by the photoelectric conversion section,
wherein the charge transfer electrode of the charge transfer section comprises
a first electrode layer comprising a silicon conductive film formed on a gate oxide film formed on the surface of the semiconductor substrate;
a second electrode layer comprising a silicon conductive film formed on a gate oxide film wherein the second electrode layer is formed to sit astride and run on said first electrode layer;
a sidewall dielectric film formed on sidewalls of said first and second electrode layers, wherein said first and second electrode layers share a common end and each of the first and second electrode have a non-common end, wherein, at the non-common ends of the first and second electrodes, the sidewall dielectric film is formed solely on the sidewalls; and
a metal silicide film formed on the surfaces of said first and second electrode layers exposed from said sidewall dielectric film.

2. The solid-state image pickup device according to claim 1, wherein said second electrode layer is formed so as to sit astride and run on said first electrode layer via an interelectrode dielectric film from said gate oxide film.

3. The solid-state image pickup device according to claim 1, wherein said silicon conductive film is a doped polycrystalline silicon film.

4. The solid-state image pickup device according to claim 1, wherein said silicon conductive film is a doped amorphous silicon film.

5. The solid-state image pickup device according to claim 1, wherein said metal suicide film is titanium silicide.

6. The solid-state image pickup device according to claim 1, wherein said metal suicide film is cobalt silicide.

7. The solid-state image pickup device according to claim 1, wherein said metal suicide film is at least one of nickel silicide, palladium silicide, platinum suicide and tantalum silicide.

* * * * *